United States Patent
Han

(10) Patent No.: US 11,355,709 B2
(45) Date of Patent: Jun. 7, 2022

(54) LIGHT-EMITTING DEVICE AND MANUFACTURING METHOD THEREOF

(71) Applicant: BOE TECHNOLOGY GROUP CO., LTD., Beijing (CN)

(72) Inventor: Dengbao Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 125 days.

(21) Appl. No.: 16/765,609

(22) PCT Filed: May 13, 2019

(86) PCT No.: PCT/CN2019/086646
§ 371 (c)(1),
(2) Date: May 20, 2020

(87) PCT Pub. No.: WO2020/227890
PCT Pub. Date: Nov. 19, 2020

(65) Prior Publication Data
US 2021/0408384 A1    Dec. 30, 2021

(51) Int. Cl.
*H01L 51/00* (2006.01)
*H01L 51/50* (2006.01)
*H01L 51/56* (2006.01)

(52) U.S. Cl.
CPC ...... *H01L 51/0027* (2013.01); *H01L 51/0003* (2013.01); *H01L 51/0028* (2013.01); *H01L 51/0037* (2013.01); *H01L 51/5092* (2013.01); *H01L 51/56* (2013.01); *H01L 2251/303* (2013.01)

(58) Field of Classification Search
CPC ............ H01L 51/0027; H01L 51/0003; H01L 51/0028; H01L 51/0037
See application file for complete search history.

(56) References Cited

U.S. PATENT DOCUMENTS

| 9,793,056 | B1 | 10/2017 | Bag et al. |
| 2019/0093010 | A1 | 3/2019 | Rand et al. |
| 2020/0013976 | A1 | 1/2020 | Zhong et al. |

FOREIGN PATENT DOCUMENTS

| CN | 108269940 A | 7/2018 |
| CN | 108511633 A | 9/2018 |
| CN | 108878672 A | 11/2018 |
| CN | 109196147 A | 1/2019 |

OTHER PUBLICATIONS

Huang H, Zhao F, Liu L, et al. Emulsion Synthesis of Size-tunable CH3NH3PbBr3 Quantum Dots: an Alternative Route toward Efficient Light-Emitting Diodes[J], ACS AppL. Mater. & interfaces, 2015, 7 28128-28133.

(Continued)

*Primary Examiner* — Anthony Ho
(74) *Attorney, Agent, or Firm* — Dilworth & Barrese, LLP.; Michael J. Musella, Esq.

(57) ABSTRACT

A light-emitting device and a manufacturing method thereof are disclosed. The manufacturing method of the light-emitting device includes: forming a function layer that has a first surface; performing plasma treatment on the first surface of the function layer; and forming a perovskite-type light-emitting layer on the first surface treated by the plasma treatment.

19 Claims, 10 Drawing Sheets

(56) References Cited

OTHER PUBLICATIONS

Li J, Xu L, Wang T, et al. 50-Fold EQE Improvement up to 6.27% of Solution-Processed All-Inorganic Perovskite $CsPbBr_3$ QLEDs via Surface Ligand Density Control[J], Adv. Mater. 2017, 29, 1603885.

Cho H, Jeong S H, Park M H, et al. Overcoming the Electroluminescence Efficiency Limitations of Perovskite Light-Emitting Diodes[J]. Science, 2015, 350, 1222-1225.

Zhao L, Yeh Y W, Tran N L, et al. In Situ Preparation of Metal Halide Perovskite Nanocrystal Thin Films for Improved Light-Emitting Devices[J], ACS Nano, 2017,11, 3957-3964.

LIGHT-EMITTING DEVICE AND MANUFACTURING METHOD THEREOF

TECHNICAL FIELD

Embodiments of the present disclosure relate to a light-emitting device and a manufacturing method thereof.

BACKGROUND

Perovskite materials usually refer to materials including a component $ABX_3$ and have excellent optical and optoelectronic properties. A perovskite electroluminescent device formed based on the perovskite materials has characteristics of high external quantum efficiency, continuously adjustable emission spectrum, high color purity, low cost and so on, and thus are widely applicable in fields of display and illumination. However, a perovskite light-emitting diode (PeLED) formed based on the perovskite materials has disadvantages of complex structure, low external quantum efficiency and so on. Compared with an organic light-emitting diode (OLED) device which has been widely used at present, there is still much room for improvement of the perovskite light-emitting diode device. The forming of a high-quality perovskite light-emitting film has strict requirements on the surface smoothness and wettability of a substrate material under the perovskite light-emitting film, which limits the selection of the substrate material under the perovskite light-emitting film and further limits the design of the structure of the perovskite electroluminescent device.

SUMMARY

At least one embodiment of the present disclosure provides a manufacturing method of a light-emitting device and the method includes: forming a function layer, wherein the function layer has a first surface; performing a plasma treatment on the first surface of the function layer; and forming a perovskite-type light-emitting layer on the first surface treated by the plasma treatment.

For example, in the manufacturing method of the light-emitting device provided by at least one embodiment of the present disclosure, the plasma treatment comprises at least one selected from a group consisting of oxygen plasma treatment, nitrogen plasma treatment and argon plasma treatment.

For example, in the manufacturing method of the light-emitting device provided by at least one embodiment of the present disclosure, a gas pressure for the plasma treatment is ranged from 20 Pa to 50 Pa, and a time for the plasma treatment is ranged from 2 minutes to 5 minutes.

For example, in the manufacturing method of the light-emitting device provided by at least one embodiment of the present disclosure, the function layer is a hole injection layer, and a material of the function layer comprises at least one selected from a group consisting of poly(3,4-ethylene dioxythiophene): poly(styrene sulfonic acid) (PEDOT:PSS), polyvinyl carbazole (PVK), poly[(9,9-dioctylfluorenyl-2,7-diyl)-co-(4,4'-(N-(p-butylphenyl))diphenylamine)] (TFB) and poly[bis(4-phenyl)(4-butylphenyl)amine] (Poly-TPD).

For example, in the manufacturing method of the light-emitting device provided by at least one embodiment of the present disclosure, the function layer is an electron injection layer, and a material of the function layer comprises zinc oxide (ZnO).

For example, in the manufacturing method of the light-emitting device provided by at least one embodiment of the present disclosure, the perovskite-type light-emitting layer comprises a material with a molecular formula $ABX_3$, wherein A is metal cation or alkyl ammonium salt ion, B is metal cation, and X is halogen anion.

For example, in the manufacturing method of the light-emitting device provided by at least one embodiment of the present disclosure, A comprises at least one selected from a group consisting of an organic amine group, an amidine group, $Cs^+$, $K^+$ and $Rb^+$; B comprises at least one selected from a group consisting of $Pb^{2+}$, $Sn^{2+}$, $Ge^{2+}$, $Ga^{2+}$, $In^{3+}$, $Cd^{2+}$, $Hg^{2+}$, $Ni^{2+}$, $Mn^{2+}$, $Bi^{3+}$ and $Sb^{3+}$; X comprises at least one selected from a group consisting of $Cl^-$, $Br^-$ and $I^-$.

For example, in the manufacturing method of the light-emitting device provided by at least one embodiment of the present disclosure, the forming the perovskite-type light-emitting layer on the first surface treated by the plasma treatment comprises: forming a precursor solution for forming the perovskite-type light-emitting layer by dissolving $AX_n$ and $BX_m$ which are used as solutes in a first solvent; and forming the perovskite-type light-emitting layer on the first surface treated by the plasma treatment by using the precursor solution for forming the perovskite-type light-emitting layer, wherein $AX_n$ reacts with $BX_m$ to generate $ABX_3$, and both m and n are positive integers.

For example, in the manufacturing method of the light-emitting device provided by at least one embodiment of the present disclosure, the forming the perovskite-type light-emitting layer on the first surface treated by the plasma treatment by using the precursor solution for forming the perovskite-type light-emitting layer comprises: spin-coating the precursor solution for forming the perovskite-type light-emitting layer on the first surface treated by the plasma treatment; adding a second solvent to the precursor solution for forming the perovskite-type light-emitting layer in a process of the spin-coating, wherein the second solvent is immiscible with the first solvent; and performing an annealing treatment to obtain the perovskite-type light-emitting layer.

For example, in the manufacturing method of the light-emitting device provided by at least one embodiment of the present disclosure, the first solvent is at least one selected from a group consisting of anhydrous N, N-dimethylformamide (DMF), dimethyl sulfoxide (DMSO), gamma-butyrolactone (GBL) and acetonitrile (ACN), and the second solvent comprises at least one selected from a group consisting of toluene, chloroform, chlorobenzene and acetone.

For example, in the manufacturing method of the light-emitting device provided by at least one embodiment of the present disclosure, a temperature for the annealing treatment is ranged from 70° C. to 80° C., and a time for the annealing treatment is ranged from 20 minutes to 40 minutes.

For example, in the manufacturing method of the light-emitting device provided by at least one embodiment of the present disclosure, a contact angle between the precursor solution for forming the perovskite-type light-emitting layer and the first surface treated by the plasma treatment is less than 16°.

For example, the manufacturing method of the light-emitting device provided by at least one embodiment of the present disclosure further includes: dissolving AI and $B(I)_m$ which are used as solutes in the first solvent to form a first precursor solution, and forming a perovskite-type light-emitting layer emitting red light on the first surface treated by the plasma treatment by using the first precursor solution, wherein AI reacts with $B(I)_m$ to generate $ABI_3$.

For example, the manufacturing method of the light-emitting device provided by at least one embodiment of the present disclosure further includes: dissolving ABr and $B(Br)_m$ which serve as solutes in the first solvent to form a second precursor solution, and forming a perovskite-type light-emitting layer emitting green light on the first surface treated by the plasma treatment by using the second precursor solution, wherein reacting ABr reacts with $B(Br)_m$ to generate $AB(Br)_3$.

For example, the manufacturing method of the light-emitting device provided by at least one embodiment of the present disclosure further includes: dissolving ACl and $B(Br)_m$ which are solutes in the first solvent to form a third precursor solution, and forming a perovskite-type light-emitting layer emitting blue light on the first surface after the plasma treatment, wherein ACl reacts with $B(Br)_m$ to generate $AB(Br)_2Cl$.

For example, the manufacturing method of the light-emitting device provided by at least one embodiment of the present disclosure further includes: performing an annealing treatment on the function layer before performing the plasma treatment.

At least one embodiment of the present disclosure further provides a light-emitting device which includes: a function layer and a perovskite-type light-emitting layer; the function layer has a first surface; the perovskite-type light-emitting layer is in direct contact with the first surface of the function layer, the first surface of the function layer contains a hydrophilic group.

For example, in the light-emitting device provided by at least one embodiment of the present disclosure, the plasma comprises at least one selected from a group consisting of oxygen plasma, nitrogen plasma and argon plasma.

For example, in the light-emitting device provided by at least one embodiment of the present disclosure, the perovskite-type light-emitting layer has a surface roughness of less than 2 nm.

For example, in the light-emitting device provided by at least one embodiment of the present disclosure, the function layer is a hole injection layer, and a material of the function layer comprises at least one selected from a group consisting of poly(3,4-ethylenedioxythiophene)-poly(styrene sulfonic acid) (PEDOT:PSS), polyvinyl carbazole (PVK) and pentafluorobenzyl (PFB).

For example, in the light-emitting device provided by at least one embodiment of the present disclosure, the material of the function layer is poly(3,4-ethylenedioxythiophene)-poly(styrene sulfonic acid) (PEDOT:PSS), and the function layer made of the PEDOT:PSS has a surface close to the perovskite-type light-emitting layer, and the surface of the function layer contains the hydrophilic group and is in direct contact with the perovskite-type light-emitting layer.

For example, the light-emitting device provided by at least one embodiment of the present disclosure further includes an electron injection layer, a modified electrode, a first electrode and a second electrode. The electron injection layer is on a side of the perovskite-type light-emitting layer facing away from the hole injection layer; the modified electrode is on a side of the electron injection layer facing away from the perovskite-type light-emitting layer; and the first electrode and a second electrode, wherein the hole injection layer, the perovskite-type light-emitting layer, the electron injection layer and the modified electrode are sandwiched between the first electrode and the second electrode.

For example, in the light-emitting device provided by at least one embodiment of the present disclosure, the function layer is an electron injection layer, a material of the function layer comprises zinc oxide (ZnO), the function layer made of ZnO has a surface close to the perovskite-type light-emitting layer, the surface of the function layer has the hydrophilic group and is in direct contact with the perovskite-type light-emitting layer.

For example, the light-emitting device provided by at least one embodiment of the present disclosure further includes a hole injection layer, a modified electrode, a first electrode and a second electrode. The hole injection layer is on a side of the perovskite-type light-emitting layer facing away from the electron injection layer; the modified electrode is on a side of the electron injection layer facing away from the perovskite-type light-emitting layer; the hole injection layer, the perovskite-type light-emitting layer, the electron injection layer and the modified electrode are sandwiched between the first electrode and the second electrode.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

An embodiment of the present disclosure provides a manufacturing method of a light-emitting device, and the method includes: forming a function layer that has a first surface; performing a plasma treatment on the first surface of the function layer; and forming a perovskite-type light-emitting layer on the first surface after the plasma treatment.

Figure 1A:
FIG. 1A-FIG. 1F are schematic diagrams of a manufacturing method of a light-emitting device provided by an embodiment of the present disclosure.
Figure 1B:
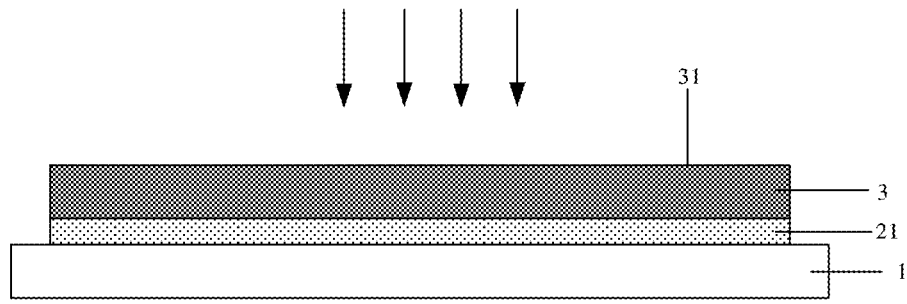
Figure 1C:
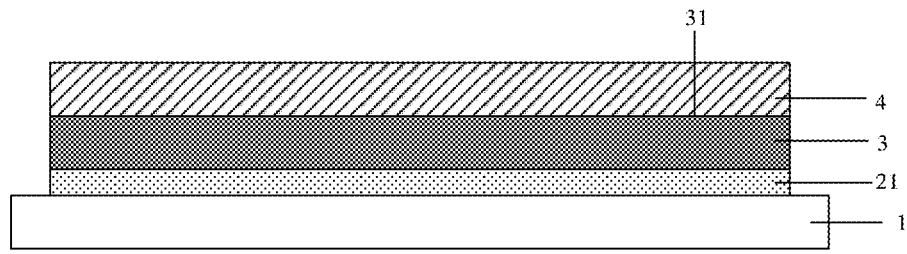
Figure 1D:
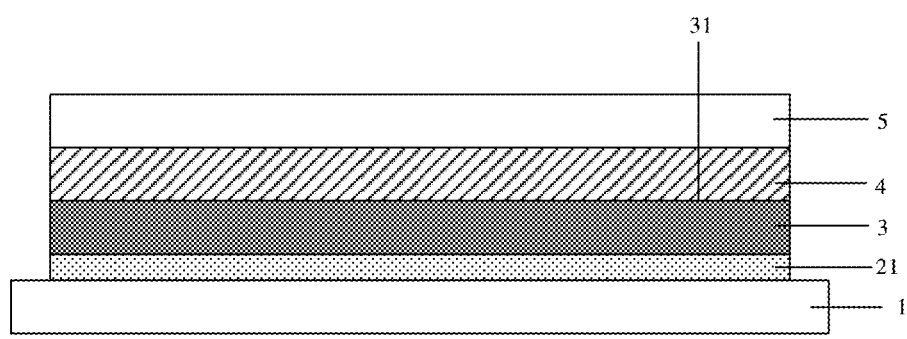
Figure 1E:
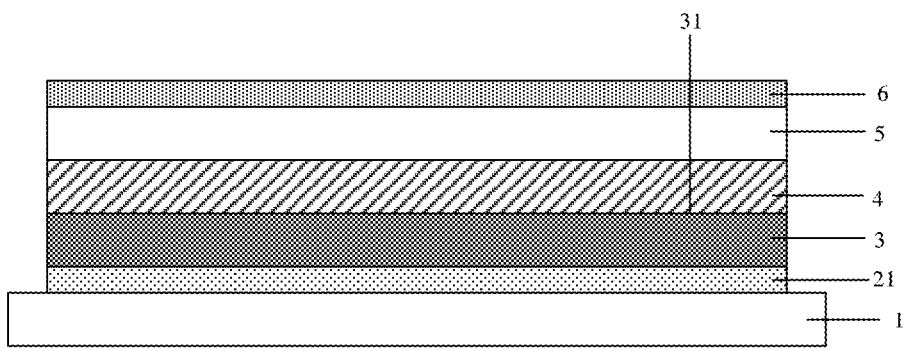
Figure 1F:
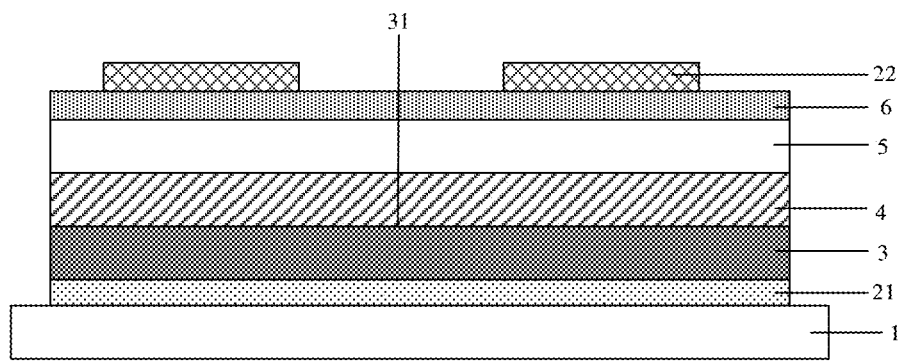
Figure 2A:
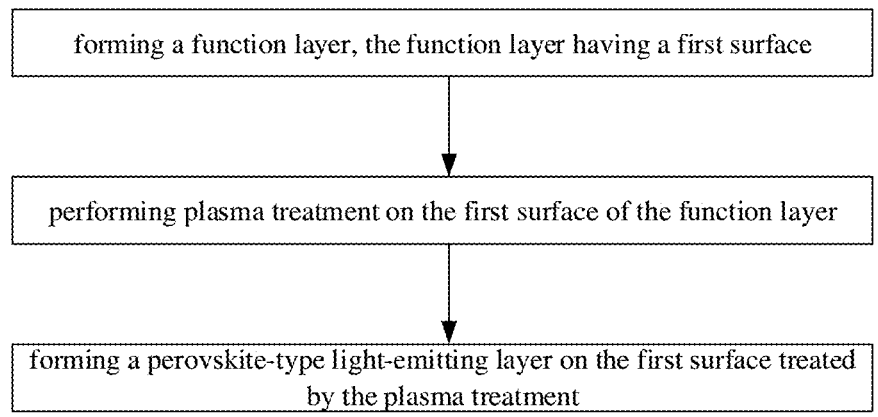
FIG. 2A is a flowchart of a manufacturing method of the light-emitting device provided by an embodiment of the present disclosure.

Illustratively, FIG. 1A-FIG. 1F are schematic diagrams of the manufacturing method of the light-emitting device provided in an embodiment of the disclosure, and FIG. 2A is a flowchart of the manufacturing method of the light-emitting device provided in an embodiment of the disclosure. The manufacturing method of the light-emitting device provided by this embodiment includes the following steps.

As illustrated in FIG. 1A, a base substrate 1 is provided. The base substrate 1 is cleaned. For example, the base substrate 1 is sequentially wiped by deionized water, an acetone solution, an ethanol solution and an isopropanol solution and then is cleaned ultrasonically, and the base substrate 1 is dried by using nitrogen after cleaning. A plasma pretreatment is performed on the cleaned base substrate 1 to enhance the wettability of the surface of the base substrate 1. For example, the plasma pretreatment includes at least one selected from the group consisting of oxygen plasma treatment, nitrogen plasma treatment and argon plasma treatment. For example, a material of the base substrate 1 is an inorganic material such as glass, quartz, indium tin oxide (ITO), or an organic material such as polyimide, and the embodiments of the present disclosure are not limited thereto.

Then, a first electrode 21 is formed on the base substrate 1. The electrode is, for example, a transparent electrode or an opaque electrode.

As illustrated in FIG. 1B, a function layer 3 is formed on a side, of the first electrode 21, facing away from the base substrate 1. The function layer 3 has a first surface 31. For example, in an embodiment, the function layer 3 is a hole injection layer, and a material of the function layer 3 includes at least one selecting from the group consisting of poly(3,4-ethylene dioxythiophene): poly(styrene sulfonic acid) (PEDOT:PSS), polyvinyl carbazole (PVK), poly[(9,9-dioctylfluorenyl-2,7-diyl)-co-(4,4'-(N-(p-butylphenyl)) diphenylamine)] (TFB).

As illustrated in FIG. 1B, the plasma treatment is performed on the first surface 31 of the function layer 3. For example, the plasma treatment includes at least one selected from the group consisting of oxygen plasma treatment, nitrogen plasma treatment and argon plasma treatment. In this embodiment, the manufacturing method of the light-emitting device and the technical effect of the manufacturing method are introduced, taking the case that the material of the function layer 3 is the poly(3,4-ethylene dioxythiophene): poly(styrene sulfonic acid) (PEDOT:PSS) and the oxygen plasma treatment is performed on the first surface 31 of the function layer 3 as an example.

For example, a device with the prepared function layer 3 is moved into a chamber of a plasma cleaning machine, and after a plurality of times of vacuumizing/oxygen introduction operations, an oxygen atmosphere in the chamber is ensured. Then, the treatment effect is adjusted by adjusting parameters such as a rate of work of the oxygen plasma treatment, a gas pressure in the chamber and treatment time of the oxygen plasma treatment. For example, a range of the gas pressure for the plasma treatment is from 20 Pa to 50 Pa to obtain a suitable plasma concentration; a range of the treatment time of the plasma treatment is from 2 minutes to 5 minutes; a range of the rate of work of the plasma treatment is from 30 W to 40 W. For example, the rate of work refers to the rate of work of a plasma processing equipment. The treatment time and the rate of work of the plasma treatment affect the number of protrusions on the first surface 31, thus affect a specific surface area, also affect the number of hydrophilic groups including nitrogen or oxygen or the like contained in the first surface 31, and thus affect both the performance of the perovskite-type light-emitting layer formed on the first surface 31 treated by the plasma treatment and the effect of the bonding of the perovskite-type light-emitting layer with the first surface 31. By adopting the above conditions, the first surface 31 of the function layer 3 have a suitable specific surface area and suitable hydrophilic groups including nitrogen or oxygen or the like, so that the first surface 31 of the function layer 3 is better modified, which is beneficial to improving the performance of the perovskite-type light-emitting layer formed on the first surface 31 of the function layer 3.

As illustrated in FIG. 1C, the perovskite-type light-emitting layer 4 is formed on the first surface 31 treated by the plasma treatment. For example, a precursor solution for forming the perovskite-type light-emitting layer is prepared first, and then the perovskite-type light-emitting layer 4 is formed on the first surface 31 treated by the plasma treatment using the precursor solution for forming the perovskite-type light-emitting layer. Because the plasma treatment is performed on the first surface 31 of the function layer 3, the wettability of the precursor solution for forming the perovskite-type light-emitting layer to the first surface 31 is improved, and a contact angle becomes smaller, so that the formed perovskite-type light-emitting layer 4 is smoother. For example, the surface roughness of the perovskite-type light-emitting layer is less than 2 nm, and thus the light emitting performance of the perovskite-type light-emitting layer is improved, for example, the external quantum efficiency of the light-emitting device is improved. In addition, the light transmittance of the function layer 3 treated by the plasma treatment is improved, which is beneficial to improving the light utilization rate of the light-emitting device.

It should be noted that the perovskite-type light-emitting layer 4 in the present disclosure is different from an organic light-emitting diode (OLED) light-emitting layer. For example, the perovskite-type light-emitting layer 4 includes the material with a molecular formula $ABX_3$. A represents metal cation or alkyl ammonium salt ion, B represents metal cation, and X represents halogen anion. For example, A includes at least one selected from the group consisting of an organic amine group (e.g., alkylamine group $RNH_4^+$, R represents alkyl, e.g., the alkylamine group is $CH_3NH_4^+$), an amidine group (e.g., formamidine group $NH_2CH=NH_2^+$, etc.), $Cs^+$, $K^+$ and $Rb^+$; B includes at least one selected from the group consisting of $Pb^{2+}$, $Sn^{2+}$, $Ge^{2+}$, $Ga^{2+}$, $In^{3+}$, $Cd^{2+}$, $Hg^{2+}$, $Ni^{2+}$, $Mn^{2+}$, $Bi^{3+}$ and $Sb^{3+}$; X includes at least one selected from the group consisting of $Cl^-$, $Br^-$, $I^-$.

For example, the step of forming the perovskite-type light-emitting layer 4 on the first surface 31 treated by the plasma treatment includes: dissolving $AX_n$ and $BX_m$ which serve as solutes in a first solvent to form the precursor solution for forming the perovskite-type light-emitting layer; and forming the perovskite-type light-emitting layer 4 on the plasma treated first surface 31 by using the precursor solution for forming the perovskite-type light-emitting layer. $AX_n$ reacts with $BX_m$ to generate $ABX_3$, both m and n are positive integers. For example, in the case that A is a monovalent ion and B is a divalent ion, n=1 and m=2; or, in the case that A is a monovalent ion and B is a trivalent ion, n=1 and m=3.

For example, the step of forming the perovskite-type light-emitting layer 4 on the first surface 31 treated by the plasma treatment by using the precursor solution for forming the perovskite-type light-emitting layer includes: spin-coating the precursor solution for forming the perovskite-type light-emitting layer on the first surface 31 treated by the plasma treatment; adding a second solvent to the precursor solution for forming the perovskite-type light-emitting layer in the spin-coating process, in which the second solvent is immiscible with the first solvent; and performing an annealing treatment on the formed structure above to obtain the perovskite-type light-emitting layer 4.

For example, the first solvent is at least one selected from the group consisting of anhydrous N, N-dimethylformamide (DMF), dimethyl sulfoxide (DMSO), gamma-butyrolactone (GBL) and acetonitrile (ACN), and the second solvent includes at least one selected from the group consisting of toluene, chloroform, chlorobenzene and acetone. The first solvent and the second solvent are not limited to the types listed above, and can be specifically determined according to the perovskite material of the formed perovskite-type light-emitting layer.

For example, the manufacturing method of the light-emitting device provided by an embodiment of the present disclosure further includes: adding a halogenated amine ligand material to the precursor solution for forming the perovskite-type light-emitting layer; and spin-coating the precursor solution which is used for forming the perovskite-type light-emitting layer and is added with the halogenated amine ligand material on the first surface 31 treated by the plasma treatment. For example, the halogenated amine ligand material is a brominated amine ligand material; or for example, chlorinated amine ligand material or iodized amine ligand material may be used.

Specifically, the brominated ammonium ligand material includes any one or more of a group consisting of brominated 3,3-diphenylpropylamine, ethylamine bromide, butylamine bromide, octylamine bromide, phenylethylamine bromide and amphetamine bromide. Taking the case that the brominated ammonium ligand material is brominated 3,3-diphenylpropylamine (DPPA-Br) as an example, the preparation of this ligand material is described. A certain amount of 3,3-diphenylpropylamine (DPPA) and ethanol are mixed in a volume ratio of 1:1 and cooled to below 10° C. by using an ice-water bath, then a slightly excessive HBr aqueous solution is added dropwise to generate a reaction for two hours. After drying by rotary evaporation, recrystallization using ethanol is performed on the production, then suction filtration and washing with anhydrous ether for 3 times are performed on the production, and finally vacuum drying at 50° C. for 12 hours is performed to obtain the brominated ammonium ligand material.

For example, in the spin-coating process, a certain amount of the second solvent is added to the precursor solution for forming the perovskite-type light-emitting layer to crystallize the perovskite material, and the halogenated amine ligand material is grafted on the crystallized perovskite material to form a perovskite film. For example, after the spin-coating is started, the second solvent is added dropwise at the sixth second. For example, the second solvent is added dropwise within 1 minute, so as to obtain a better perovskite material crystallization effect.

For example, the temperature of the annealing treatment is from 70° C. to 80° C. and the time of the annealing treatment is from 20 min to 40 min so as to achieve a desired effect.

Figures 3A, 3B:
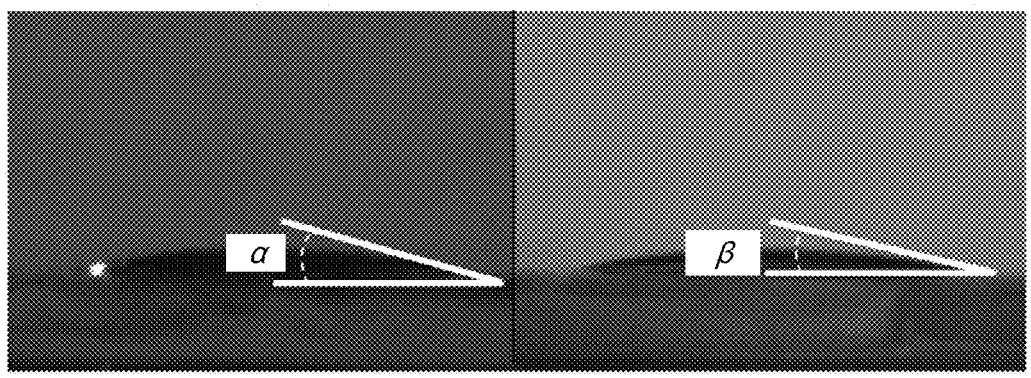
FIG. 3A-FIG. 3B are comparative graphs of measurement results of contact angles before and after plasma treatment of a first surface of a function layer in an embodiment of the disclosure.

For example, the contact angle between the precursor solution for forming the perovskite-type light-emitting layer and the first surface treated by the plasma treatment is less than 16°. FIG. 3A-FIG. 3B are comparative graphs of measurement results of contact angles before and after the plasma treatment of the first surface of the function layer in an embodiment of the present disclosure. The angle α illustrated in FIG. 3A is the contact angle in the case that the precursor solution for forming the perovskite-type light-emitting layer is spin-coated on the first surface which is included by the function layer and which is not undergone the plasma treatment, and α=16°. The angle β illustrated in FIG. 3B is the contact angle in the case that the precursor solution for forming the perovskite-type light-emitting layer is spin-coated on the first surface 31 treated by the plasma treatment of the function layer, and β=12.5°. Thus, the plasma treatment on the first surface 31 of the function layer 3 can improve the wettability of the precursor solution for forming the perovskite-type light-emitting layer to the first surface 31 and reduce the contact angle in the case that the precursor solution is formed on the plasma treated first surface 31 of the function layer 3, so that the perovskite-type light-emitting layer 4 obtained after the annealing treatment is smoother and the luminescent performance is improved; for example, the external quantum efficiency of the luminescent device is improved. Therefore, in the case that the function layer 3 is the above hole injection layer, the function layer 3 has the function of a hole transport layer and does not need to be separately provided with a hole transport layer, and thus the manufacturing process and structure of the light-emitting device are simplified.

Figure 4:
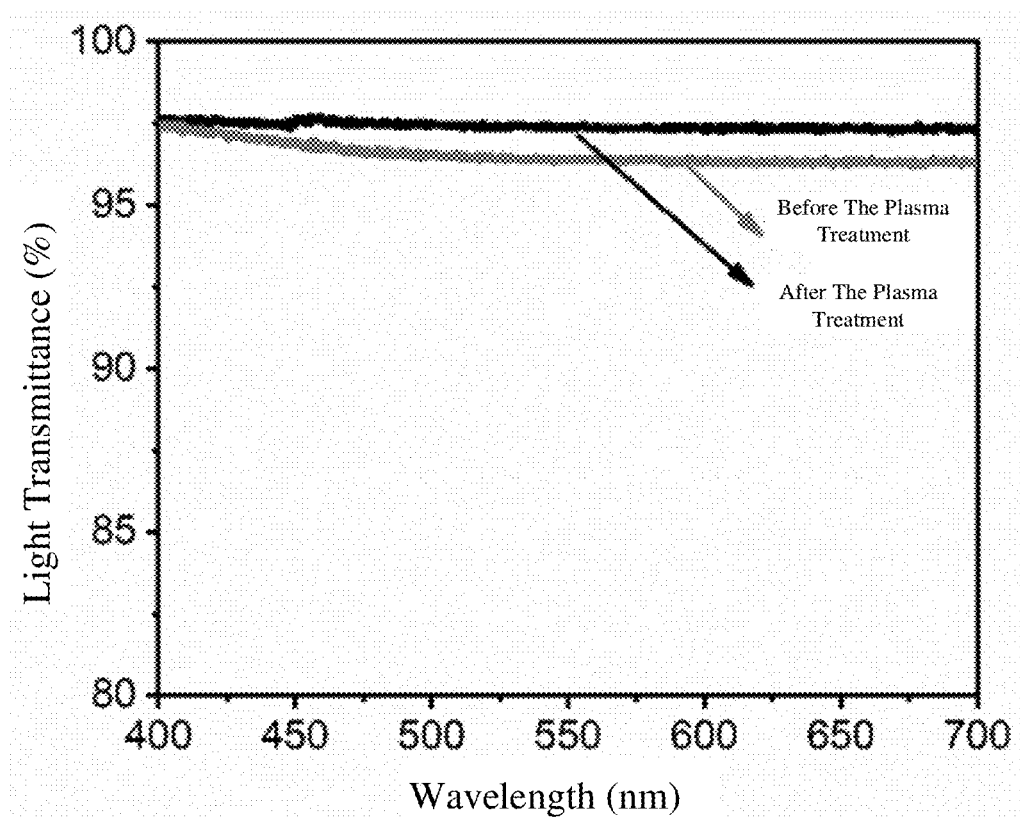
FIG. 4 is a comparative curve graph of transmittance of the function layer before and after the plasma treatment provided by an embodiment of the present disclosure.

In addition, FIG. 4 is a comparative curve graph of the transmittance of the function layer before and after the plasma treatment in an embodiment of the disclosure. The light transmittance of the function layer 3 after the plasma treatment is higher than that before the plasma treatment; for example, the light transmittance of the function layer 3 after the plasma treatment can reach 96% or more. This proves that the plasma treatment performed on the first surface 31 of the function layer 3 can improve the light transmittance of the function layer 3, thereby improving the light utilization rate of the light-emitting device.

For example, the manufacturing method of the light-emitting device includes: forming a perovskite-type light-emitting layer emitting red light, a perovskite-type light-emitting layer emitting green light and a perovskite-type light-emitting layer emitting blue light on the first surface 31 after the plasma treatment to realize color illumination or color display.

For example, AI and $B(I)_m$ serve as solutes and are dissolved in the first solvent to form a first precursor solution, and the perovskite-type light-emitting layer emitting red light is formed on the first surface treated by the plasma treatment using the first precursor solution, in which AI reacts with $B(I)_m$ to generate $ABI_3$. In this example, AI represents $NH_2CH=NH_2I$, $B(I)_m$ represents $PbI_2$, and the first solvent is anhydrous DMF.

Figure 5:
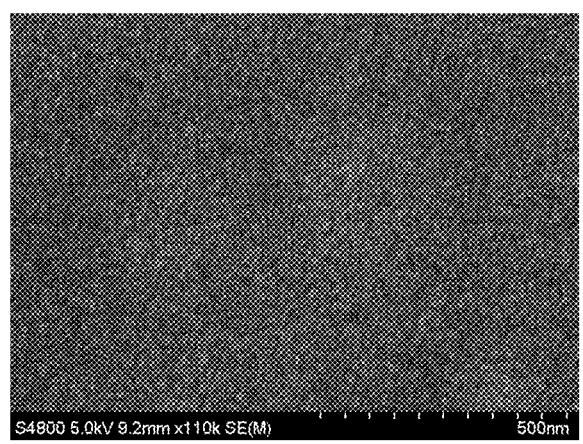
FIG. 5 is a surface SEM image of a perovskite-type light-emitting layer emitting red light in an embodiment of the disclosure.
Figure 6:
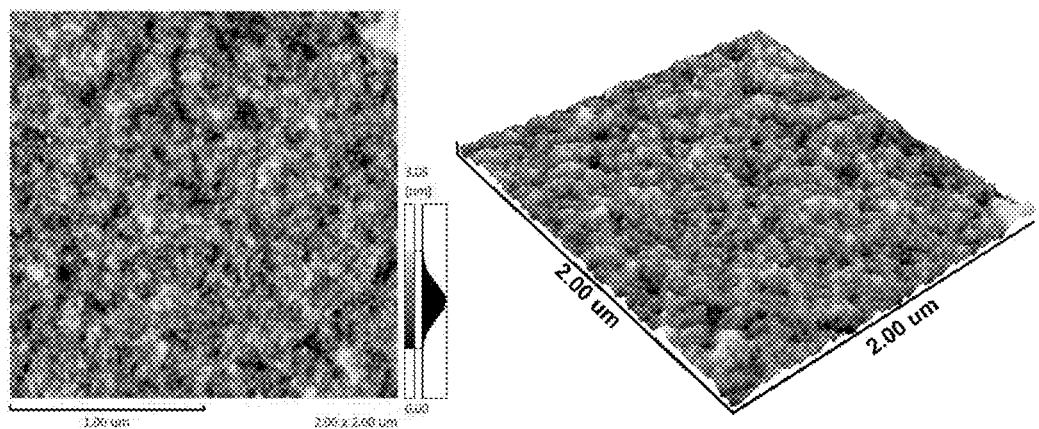
FIG. 6 is an AFM image of the surface of the perovskite-type light-emitting layer emitting red light in an embodiment of the disclosure.
Figure 7:
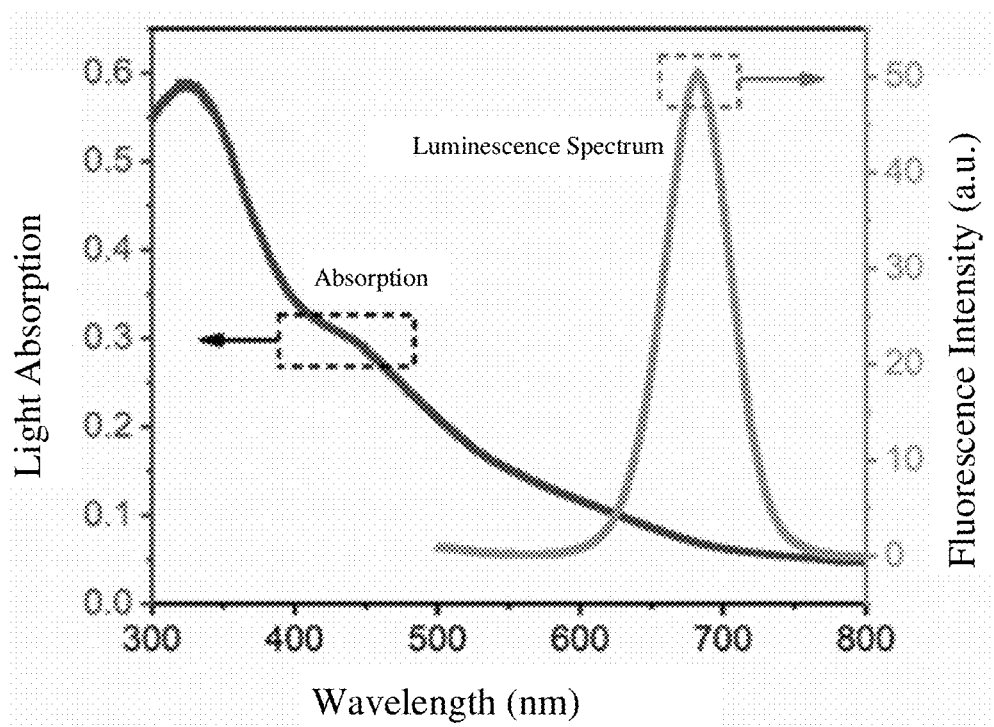
FIG. 7 is an absorption and photoluminescence spectrum curve of the perovskite-type light-emitting layer emitting red light in an embodiment of the disclosure.

For example, $NH_2CH=NH_2I$, $PbI_2$ and an amine halide are dissolved in a certain proportion in the first solvent to obtain the first precursor solution. For example, $NH_2CH=NH_2I$, $PbI_2$ and the amine halide are dissolved in the anhydrous DMF in a molar ratio of 1:1:0.5 to prepare the first precursor solution with a concentration of 0.2M. After passing through a nylon filter head of 0.22 μm, the first precursor solution is spin-coated on the first surface 31 treated by oxygen plasma; in the case that a spin-coating speed reaches 4000 rpm, for example, in the sixth second after the start, the second solvent (antisolvent) is rapidly dripped, and the second solvent is completely dripped within 1 second to rapidly form the perovskite-type film and control the formation of perovskite crystal grains in the perovskite-type film. For example, the perovskite-type light-emitting layer emitting red light is obtained after annealing at 80° C. The surface morphology of the perovskite-type light-emitting layer emitting red light is illustrated in FIG. 5 and FIG. 6. The prepared perovskite-type light-emitting layer emitting red light is very compact, has no obvious defects, has a very flat and uniform surface, and has a low surface average roughness of only 0.57 nm. FIG. 7 is an absorption and electroluminescent spectrum curve of the perovskite-type light-emitting layer emitting red light. From FIG. 7, it can be seen that the emission peak is at 675 nm and the half-peak width is only 50 nm, and thus the perovskite-type light-emitting layer emitting red light can be used to obtain a higher color gamut.

For example, ABr and $B(Br)_m$ are used as solutes and are dissolved in the first solvent to form a second precursor solution, and a perovskite-type light-emitting layer emitting green light is formed on the first surface after the plasma treatment by using the second precursor solution. ABr reacts with $B(Br)_m$ to generate $AB(Br)_3$. In this example, ABr is $NH_2CH=NH_2Br$, $B(Br)_m$ is $PbBr_2$, and the first solvent is anhydrous DMF.

Figure 8:
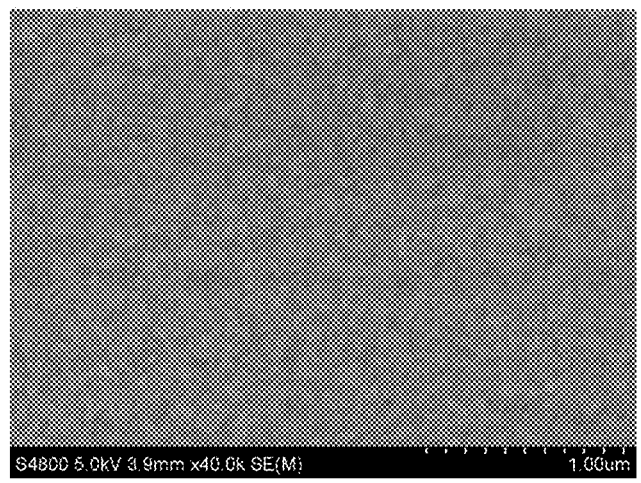
FIG. 8 is a surface SEM image of a surface of a perovskite-type light-emitting layer emitting green light in an embodiment of the disclosure.
Figure 9:
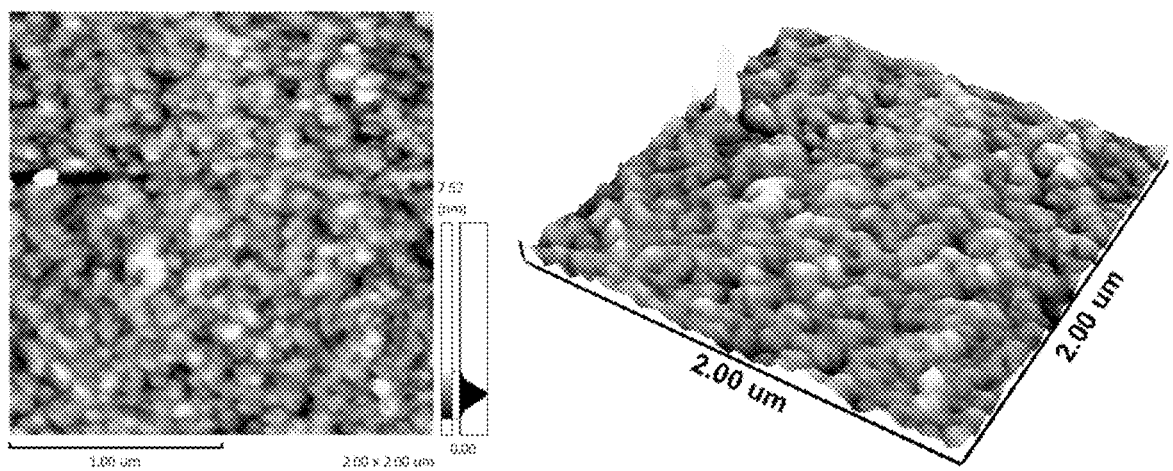
FIG. 9 is an AFM image of the surface of the perovskite-type light-emitting layer emitting green light in an embodiment of the disclosure.
Figure 10:
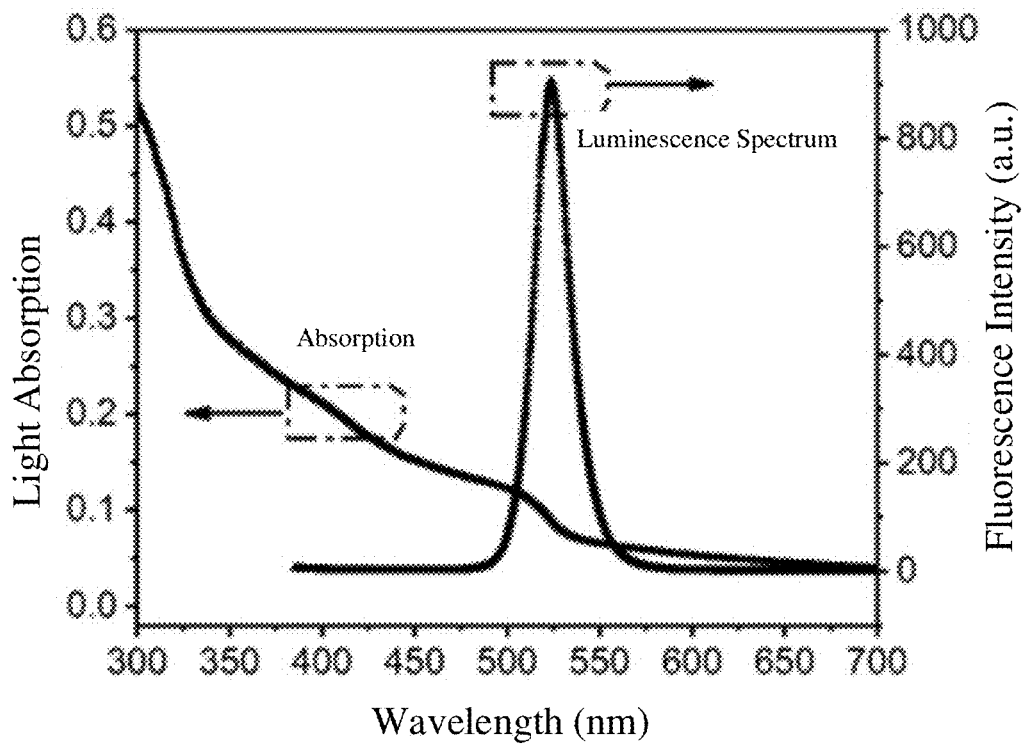
FIG. 10 is an absorption and electroluminescent spectrum curve of the perovskite-type light-emitting layer emitting green light in an embodiment of the disclosure.

For example, $NH_2CH=NH_2Br$, $PbBr_2$ and an amine halide are dissolved in a certain proportion in the first solvent to obtain the second precursor solution. For example, $NH_2CH=NH_2Br$, $PbBr_2$ and the amine halide are dissolved in the anhydrous DMF in a molar ratio of 1:1:0.35 to prepare the second precursor solution with a concentration of 0.2M. After the second precursor solution passes through a nylon filter head of 0.22 um, the second precursor solution is spin-coated on the first surface 31 treated by oxygen plasma; in the case that the speed of the spin-coating reaches 4000 rpm, for example, in the sixth second after the start, the second solvent (antisolvent) is rapidly dripped, and the second solvent is completely dripped within 1 second to rapidly form a perovskite-type film and control the formation of perovskite crystal grains in the perovskite-type film. For example, the perovskite-type light-emitting layer emitting green light is obtained after annealing at 80° C. The surface morphology of the perovskite-type light-emitting layer emitting green light is illustrated in FIG. 8 and FIG. 9. The prepared perovskite-type light-emitting layer emitting green light is very compact, has no obvious defects, has a very flat and uniform surface, and has a low surface average roughness of only 1.7 nm. FIG. 10 is an absorption and electroluminescence spectrum curve of the perovskite-type light-emitting layer emitting green light. It can be seen from FIG. 10 that the emission peak is located at 526 nm and the half-peak width is only 22 nm, and thus a higher color gamut can be obtained by using the perovskite-type light-emitting layer emitting green light.

For example, ACl and $B(Br)_m$ serve as solutes and are dissolved in the first solvent to form a third precursor solution, a perovskite-type light-emitting layer emitting blue light is formed on the first surface after the plasma treatment, and ACl reacts with $B(Br)_m$ to generate $AB(Br)_2Cl$. In this example, ABr represents $NH_2CH=NH_2Cl$, $B(Br)_m$ represents $PbBr_2$, and the first solvent is anhydrous DMF. $NH_2CH=NH_2Cl$, $PbBr_2$ and an amine halide are dissolved in anhydrous DMF in a molar ratio of 1:1:0.8 to prepare the third precursor solution with a concentration of 0.2M. After the third precursor solution passes through a nylon filter head of 0.22 um, the third precursor solution is spin-coated on the first surface 31 treated by oxygen plasma; in the case that the spin-coating speed reaches 4000 rpm, for example, in the sixth second after the start, the second solvent (antisolvent) is rapidly dripped, and the second solvent is completely dripped within 1 second to rapidly form a perovskite-type light-emitting layer emitting blue light and control the formation of perovskite crystal grains in the perovskite-type film. For example, the perovskite-type light-emitting layer emitting blue light is obtained after annealing at 80° C. The perovskite-type light-emitting layer emitting blue light is very compact, has no obvious defects, has a very flat and uniform surface and a low surface average roughness, and the emission peak of the blue light emitted by the perovskite-type light-emitting layer is from 460 nm to 480 nm.

Figure 11:
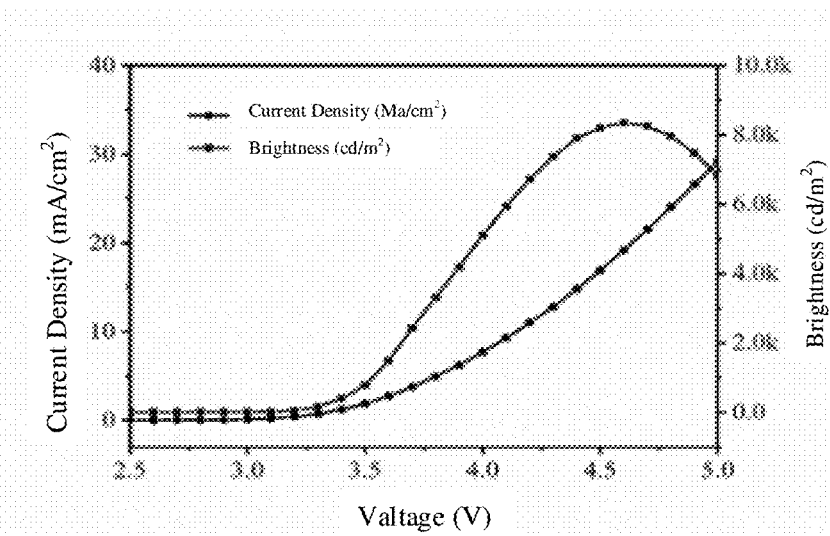
FIG. 11 is a curve of a relationship of current density/brightness and voltage of the light-emitting device which emits green light and is manufactured according to the method provided in an embodiment of the present disclosure.
Figure 12:
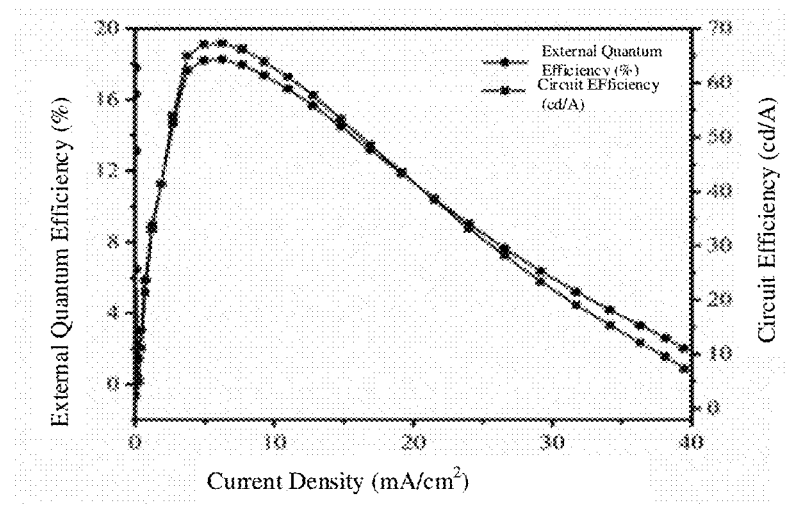
FIG. 12 is a curve of a relationship of external quantum efficiency/current efficiency and current density of the light-emitting device which emits green light and is manufactured according to the method provided by an embodiment of the present disclosure.
Figure 13:
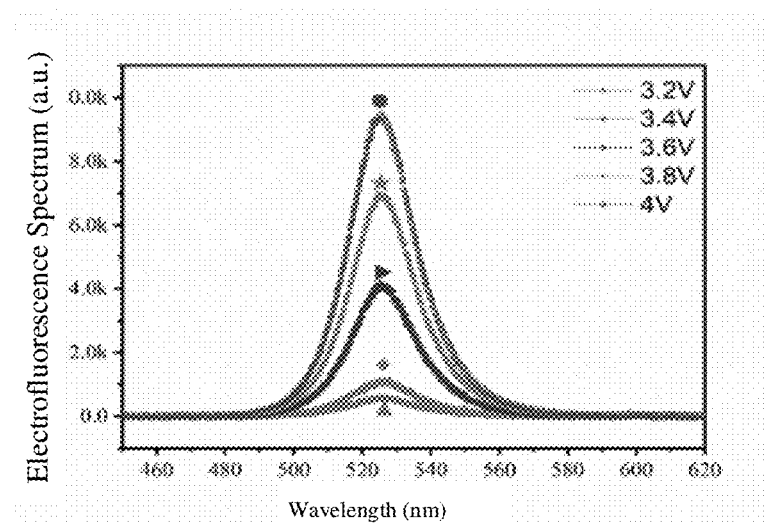
FIG. 13 is an electroluminescent spectrum of the light-emitting device emitting green light provided by an embodiment of the present disclosure.

FIG. 11 and FIG. 12 are performance parameter curves of a green-light perovskite light-emitting device prepared according to the method provided in the above embodiment of the present disclosure. A turn-on voltage of the light-emitting device is 2.9V, and the maximum brightness exceeds 8000 cd/m$^2$ at a voltage of 4.6V. Meanwhile, the external quantum efficiency of the light-emitting device can reach more than 16%, and the current efficiency exceeds 60 cd/A. FIG. 13 is a graph of a curve showing that the electroluminescence spectrum of the light-emitting device emitting green light changes with a voltage of the light-emitting device emitting green light. As can be seen from FIG. 13, at 526 nm where the peak position is always maintained, the half-peak width of the spectrum is 23 nm, which indicates very high color purity and is consistent with the photoluminescence spectrum illustrated in FIG. 10. Moreover, the peak position does not change with the increase of the voltage acting on the light-emitting device, and has higher spectrum stability.

The perovskite-type light-emitting layer is composed of nano-sized perovskite nanocrystals; for example, the size of the crystallized perovskite material is larger than 20 nm. For example, the perovskite-type light-emitting layer comprises perovskite quantum dots which can be nano-sized; for example, the perovskite quantum dots have a size of less than 20 nm. In the preparation method of the perovskite-type light-emitting layer of this embodiment, the size of the formed perovskite material after the crystallization can be controlled by controlling the amount of the added halogenated ligand material and the amount of the second solvent. In general, in the case that the amount of the halogenated ligand material is large, the perovskite quantum dots are easily formed, and the perovskite quantum dots have better luminous efficiency; in the case that the amount of halogenated ligand material is small, it is easy to form perovskite nanocrystals, and the perovskite nanocrystals have better carrier transport capability. Those skilled in the art can design as required.

As illustrated in FIG. 1D, in the case that the function layer 3 is a hole injection layer, the manufacturing method of the light-emitting device further includes: forming an electron injection layer 5 located on a side, facing away from the hole injection layer 3, of the perovskite-type light-emitting layer 4, as illustrated in FIG. 1D; forming a modified electrode 6, as illustrated in FIG. 1E; and forming a second electrode 22, as illustrated in FIG. 1F. The hole injection layer 3, the perovskite-type light-emitting layer 4 and the electron injection layer 5 are sandwiched between the first electrode 21 and the second electrode 22. The modified electrode 6 is located on a side, facing away from the perovskite-type light-emitting layer 4, of the electron injection layer 5. A material of the modified electrode 6 is LiF or CsCO$_3$ to adjust the electron injection rate, for example, to slow down the electron injection rate, so as to balance the hole injection rate and the electron injection rate and achieve better luminous effect and energy efficiency. For example, the second electrode 22 may include a plurality of portions arranged at intervals, as illustrated in FIG. 1F; or, the second electrode 22 may be a one-piece surface electrode.

For example, a material of the electron injection layer 5 includes zinc oxide (ZnO). For example, the material of the electron injection layer 5 is ZnO. ZnO has a good electron injection function and a good electron transport function, and thus the electron transport layer can be omitted. Alternatively, the electron injection layer 5 includes a zinc oxide layer and a polyethyleneimine (PEI) layer which are stacked, and the polyethyleneimine layer is located on a side, facing away from the perovskite-type light-emitting layer 4, of the zinc oxide layer. PEI layer can adjust the energy level of ZnO and slow down the electron injection rate, thus balancing the hole injection rate with the electron injection rate and achieving better luminous effect and energy efficiency.

Figure 2B:
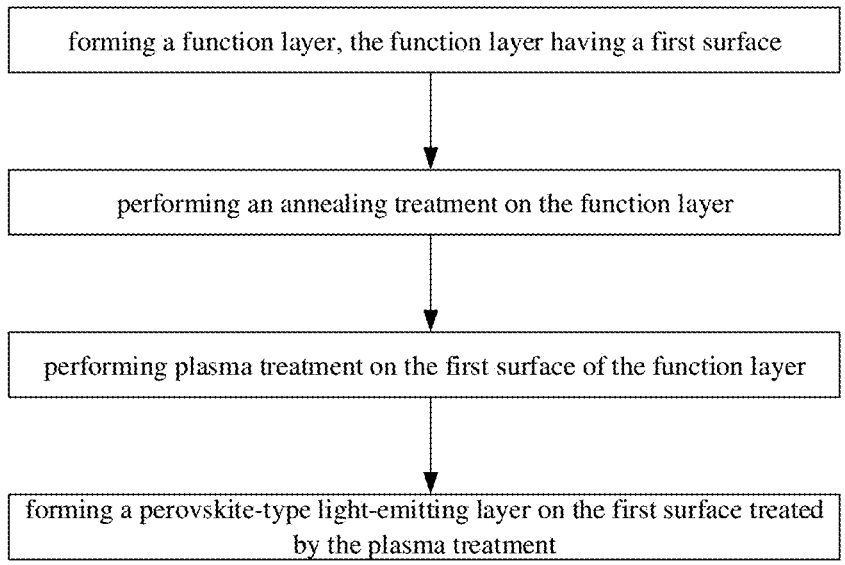
FIG. 2B is another flowchart of the manufacturing method of the light-emitting device provided by an embodiment of the present disclosure.

In another embodiment of the present disclosure, for example, referring to FIG. 2B and FIG. 1B, the manufacturing method of the light-emitting device further includes: performing an annealing treatment on the function layer 3 before performing the plasma treatment to release stress of respective structures on the base substrate 1 such as the function layer 3 and further improve the stability of the perovskite-type light-emitting layer formed on the function layer 3 at a later stage. Other steps in this embodiment are the same as those in the previous embodiments, and please refer to the previous description which is not repeated here.

FIG. 1G-FIG. 1K are another schematic diagrams of the manufacturing method of the light-emitting device according to an embodiment of the present disclosure. For example, in the manufacturing method of the light-emitting device illustrated in FIG. 1G-FIG. 1K, the function layer 30 is an electron injection layer.

Figure 1G:
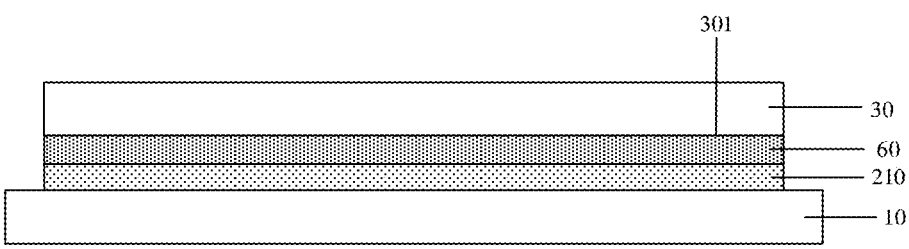
FIG. 1G-FIG. 1K are schematic diagrams of another manufacturing method of the light-emitting device provided by an embodiment of the present disclosure.

As illustrated in FIG. 1G, the manufacturing method of the light-emitting device includes: sequentially forming a first electrode 210, a modified electrode 60 and the function layer 30 on the base substrate 10. The function layer 30 is an electron injection layer, and the material of the function layer 30 includes zinc oxide (ZnO).

Figure 1H:
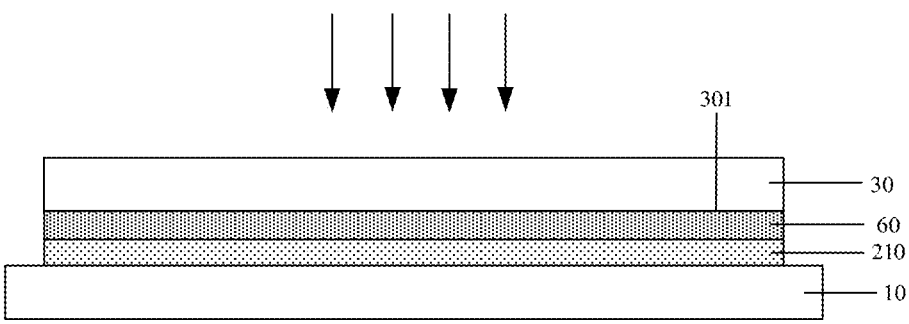

As illustrated in FIG. 1H, the manufacturing method of the light-emitting device further includes: performing the plasma treatment on the first surface 301 of the function layer 30 (i.e., the electron injection layer), the plasma treatment is the same as the plasma treatment of the electron injection layer 30 in the previous embodiment, and please refer to the previous description.

Figure 1I:
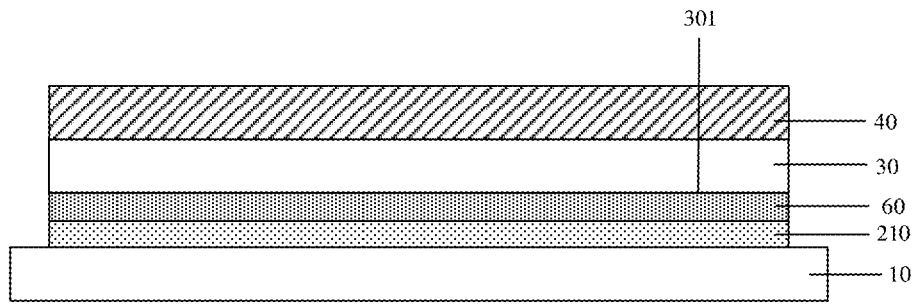

As illustrated in FIG. 1I, the manufacturing method of the light-emitting device further includes: forming the perovskite-type light-emitting layer 40 on the first surface 301 of the electron injection layer 30 treated by the plasma treatment. For a specific method of forming the perovskite-type light-emitting layer 40, please refer to the previous description.

Figure 1J:
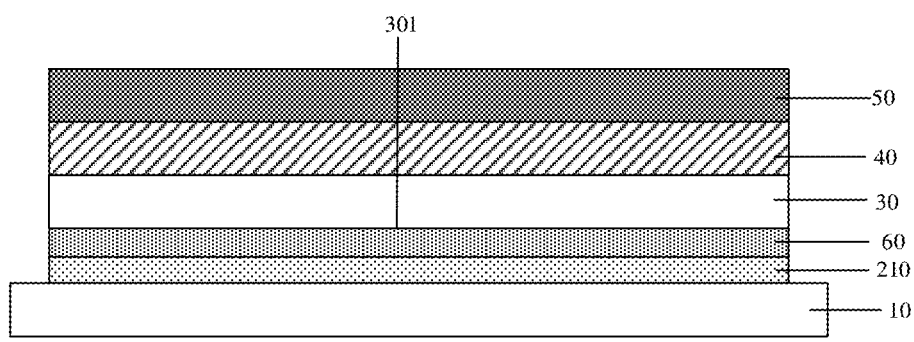
Figure 1K:
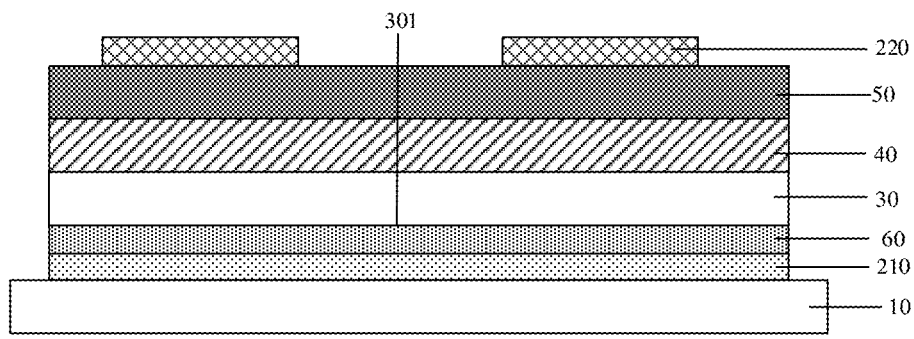

The manufacturing method of the light-emitting device further includes: forming the hole injection layer 50 on the side, facing away from the electron injection layer 30, of the perovskite-type light-emitting layer 40, as illustrated in FIG. 1J; and forming a second electrode 220 as illustrated in FIG. 1K. The hole injection layer 50, the perovskite-type light-emitting layer 40 and the electron injection layer 30 are sandwiched between the first electrode 210 and the second electrode 220.

For example, in an example, the electron injection layer 30 is a zinc oxide layer, the plasma treatment is performed on the first surface 301 of the zinc oxide layer, and the perovskite-type light-emitting layer 40 is formed on the first surface 301 of the zinc oxide layer after the plasma treatment. For example, in another example, the electron injection layer 30 includes a zinc oxide layer and a polyethyleneimine (PEI) layer which are stacked, and the polyethyleneimine layer is located on a side, close to the base substrate 10, of the zinc oxide layer, the plasma treatment is performed on the first surface 301 of the zinc oxide layer, and the perovskite-type light-emitting layer 40 is formed on the first surface 301 of the zinc oxide layer after the plasma treatment.

Other features of the manufacturing method provided by the embodiment illustrated in FIG. 1G-FIG. 1K are the same as those described in the previous embodiments, which can achieve the same or similar technical effects as the previous embodiments.

At least one embodiment of the present disclosure also provides the light-emitting device, and the light-emitting device is formed according to the manufacturing method of the light-emitting device provided by any one of the embodiments of the present disclosure. The light-emitting device includes the function layer and the perovskite-type light-emitting layer. The function layer has the first surface; the perovskite-type light-emitting layer is in direct contact with the first surface of the function layer; and the first surface of the function layer contains hydrophilic groups.

Figure 14:
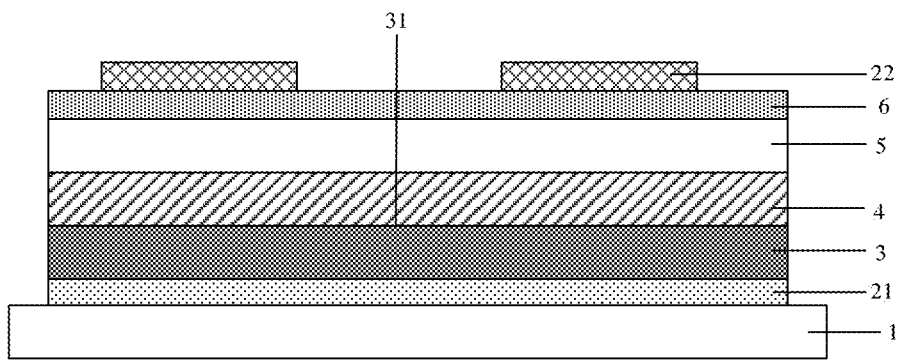
FIG. 14 is a schematic structural diagram of the light-emitting device provided by an embodiment of the present disclosure.

Illustratively, FIG. 14 is a schematic structural diagram of the light-emitting device according to an embodiment of the present disclosure. As illustrated in FIG. 14, the light-emitting device is formed according to the manufacturing methods of the light-emitting device provided in any one of the embodiments of the present disclosure. The light-emitting device includes the function layer 3 and the perovskite-type light-emitting layer 4. The function layer 3 has the first surface 31; the perovskite-type light-emitting layer 4 is in direct contact with the first surface 31 of the function layer 3; hydrophilic groups exist on the first surface 31 of the function layer 3. For example, the hydrophilic groups include oxygen-containing hydrophilic groups or nitrogen-containing hydrophilic groups. The oxygen-containing hydrophilic group is, for example, hydroxyl (OH—), and the nitrogen-containing hydrophilic group is, for example, amino. For example, the hydrophilic groups are formed by performing the plasma treatment on the first surface 31. For example, the plasma includes at least one selected from the group consisting of oxygen plasma, nitrogen plasma and argon plasma. The presence of the hydrophilic groups at the first surface 31 and the direct contact of the perovskite-type light-emitting layer 4 with the first surface 31 of the function layer 3 can make the first surface 31 coarser, so that in the process of forming the perovskite-type light-emitting layer 4 on the first surface 31, the wettability of the precursor solution for forming the perovskite-type light-emitting layer 4 to the first surface 31 is improved, thus the perovskite-type light-emitting layer 4 is smoother, for example, the surface roughness of the perovskite-type light-emitting layer is less than 2 nm, so that the luminous performance is improved, for example, the external quantum efficiency of the light-emitting device is improved, and the luminous performance is kept stable with the change of the voltage acting on the perovskite-type light-emitting layer.

For example, the function layer 3 is a hole injection layer, and the material of the function layer 3 includes at least one selected from the group consisting of poly(3,4-ethylene dioxythiophene): poly(styrene sulfonic acid) (PEDOT:PSS), polyvinyl carbazole (PVK), poly[(9,9-dioctylfluorenyl-2,7-diyl)-co-(4,4'-(N-(p-butylphenyl)) diphenylamine)] (TFB) and poly[bis (4-phenyl) (4-butylphenyl) amine] (Poly-TPD).

For example, the material of the function layer 3 is poly(3,4-ethylene dioxythiophene): poly(styrene sulfonic acid) (PEDOT:PSS), and the surface, close to the perovskite-type light-emitting layer 4, of PEDOT:PSS has the plasma and is in direct contact with the perovskite-type light-emitting layer 4. At this time, the function layer 3 has the function of the hole transport layer, and there is no need to separately arrange a hole transport layer between the first surface 31 and the perovskite-type light-emitting layer 4, thus simplifying the manufacturing process and structure of the light-emitting device.

For example, as illustrated in FIG. 14, the light-emitting device further includes the electron injection layer 5, the modified electrode 6, the first electrode 21 and the second electrode 22. The electron injection layer 5 is located on the side, facing away from the hole injection layer 3, of the perovskite-type light-emitting layer 4; the modified electrode 6 is located on the side, facing away from the perovskite-type light-emitting layer 4, of the electron injection layer 5. The hole injection layer 3, the perovskite-type light-emitting layer 4, the electron injection layer 5 and the modified electrode 6 are sandwiched between the first electrode 21 and the second electrode 22. The material of the modified electrode 6 is LiF or $CsCO_3$ to adjust the electron injection rate, for example, to slow down the electron injection rate, so as to balance the hole injection rate and the electron injection rate and achieve better luminous effect and energy efficiency.

The perovskite-type light-emitting layer is composed of nano-sized perovskite nanocrystals; for example, the size of the crystallized perovskite material is larger than 20 nm. For example, the perovskite-type light-emitting layer comprises perovskite quantum dots which are nano-sized; for example, the perovskite quantum dots have a size of less than 20 nm. Those skilled in the art can design as required.

For other unmentioned features of the light-emitting device, please refer to the description in the previous embodiments related to the manufacturing method.

It should be noted that in the present disclosure, direct contact between the perovskite-type light-emitting layer and the first surface of the function layer refers to that there is no other layer or structure between the perovskite-type light-emitting layer and the first surface of the function layer in a direction perpendicular to the base substrate.

It should be noted that the surface roughness in the present disclosure refers to the small pitch and small peak-valley unevenness of the surface, that is, a distance (wave pitch) between two peaks or two valleys on the surface in the direction perpendicular to the surface. The smaller the surface roughness, the smoother the surface.

Figure 15:
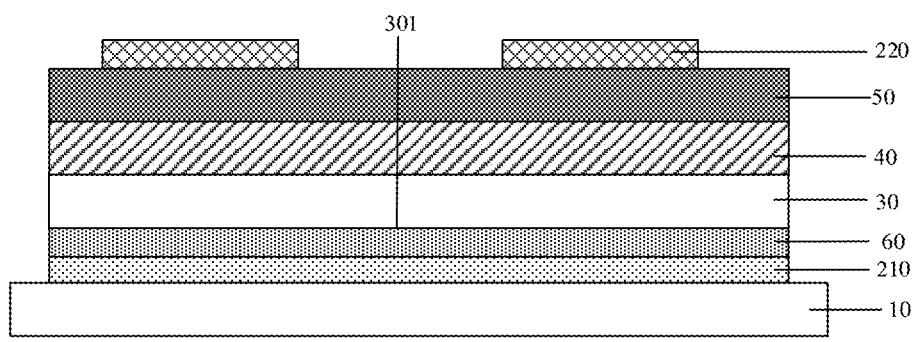
FIG. 15 is another schematic structural diagram of the light-emitting device provided by an embodiment of the present disclosure.

For example, FIG. 15 is another schematic structural diagram of the light-emitting device provided in an embodiment of the present disclosure. In this light-emitting device, the function layer 30 is an electron injection layer. The first surface 301 of the electron injection layer 30 contains the hydrophilic groups and the perovskite-type light-emitting layer 40 is in direct contact with the first surface 301.

For example, the material of the electron injection layer 30 includes zinc oxide (ZnO), and the surface, close to the perovskite-type light-emitting layer 40, of the electron injection layer 30 made of ZnO has the hydrophilic groups and is in direct contact with the perovskite-type light-emitting layer 40. For example, the material of the electron injection layer 30 is ZnO. ZnO has a good electron injection function and a good electron transport function, and thus the electron transport layer can be omitted. Alternatively, the electron injection layer 30 includes a zinc oxide layer and a polyethyleneimine (PEI) layer which are stacked, and the polyethyleneimine layer is located on the side, facing away from the perovskite-type light-emitting layer 4, of the zinc oxide layer. PEI layer can adjust the energy level of ZnO and slow down the electron injection rate, so as to thus balance the hole injection rate with the electron injection rate and to achieve better luminous effect and energy efficiency.

For example, as illustrated in FIG. 15, the light-emitting device further includes a modified electrode 60, the hole injection layer 50, the first electrode 210 and the second electrode 220. The hole injection layer 50 is located on the side, facing away from the electron injection layer 30, of the perovskite-type light-emitting layer 40; the hole injection layer 50, the perovskite-type light-emitting layer 40, the function layer 30 (i.e., the electron injection layer) and the modified electrode 60 are sandwiched between the first electrode 210 and the second electrode 220. The modified electrode 60 is located on the side, facing away from the perovskite-type light-emitting layer 4, of the electron injection layer 30. The material of the modified electrode 60 is LiF or $CsCO_3$ to adjust the electron injection rate, for example, to slow down the electron injection rate, so as to balance the hole injection rate with the electron injection rate and achieve better luminous effect and energy efficiency.

Other features of the light-emitting device provided by the embodiment illustrated in FIG. 15 are the same as those described in the previous embodiments, and the same or similar technical effects as those of the previous embodiments can be achieved.

What are described above is related to the illustrative embodiments of the disclosure only and not limitative to the scope of the disclosure; the scopes of the disclosure are defined by the accompanying claims.

What is claimed is:

1. A manufacturing method of a light-emitting device, comprising:
    forming a function layer, wherein the function layer has a first surface;
    performing a plasma treatment on the first surface of the function layer; and
    forming a perovskite-type light-emitting layer on the first surface treated by the plasma treatment, wherein
    the forming the perovskite-type light-emitting layer on the first surface treated by the plasma treatment comprises:
    forming a precursor solution for forming the perovskite-type light-emitting layer by dissolving $AX_n$ and $BX_m$, which are used as solutes in a first solvent, wherein A is metal cation or alkyl ammonium salt ion, B is metal cation, and X is halogen anion; and
    forming the perovskite-type light-emitting layer on the first surface treated by the plasma treatment by using the precursor solution for forming the perovskite-type light-emitting layer, wherein $AX_n$ reacts with $BX_m$, to generate $ABX_3$, and both m and n are positive integers.

2. The manufacturing method of the light-emitting device according to claim 1, wherein the plasma treatment comprises at least one selected from a group consisting of oxygen plasma treatment, nitrogen plasma treatment and argon plasma treatment.

3. The manufacturing method of the light-emitting device according to claim 1, wherein a gas pressure for the plasma treatment is ranged from 20 Pa to 50 Pa, and a time for the plasma treatment is ranged from 2 minutes to 5 minutes.

4. The manufacturing method of the light-emitting device according to claim 1, wherein the function layer is a hole injection layer, and a material of the function layer comprises at least one selected from a group consisting of poly(3,4-ethylene dioxythiophene): poly(styrene sulfonic acid) (PEDOT:PSS), polyvinyl carbazole (PVK), poly[(9,9-dioctylfluorenyl-2,7-diyl)-co-(4,4'-(N-(p-butylphenyl))diphenylamine)] (TFB) and poly[bis(4-phenyl)(4-butylphenyl)amine] (Poly-TPD).

5. The manufacturing method of the light-emitting device according to claim 1, wherein the function layer is an electron injection layer, and a material of the function layer comprises zinc oxide (ZnO).

6. The manufacturing method of the light-emitting device according to claim 1, wherein the perovskite-type light-emitting layer comprises a material with a molecular formula $ABX_3$, wherein A is metal cation or alkyl ammonium salt ion, B is metal cation, and X is halogen anion.

7. The manufacturing method of the light-emitting device according to claim 6, wherein A comprises at least one selected from a group consisting of an organic amine group, an amidine group, $Cs^+$, $K^+$ and $Rb^+$; B comprises at least one selected from a group consisting of $Pb^{2+}$, $Sn^{2+}$, $Ge^{2+}$, $Ga^{2+}$, $In^{3+}$, $Cd^{2+}$, $Hg^{2+}$, $Ni^{2+}$, $Mn^{2+}$, $Bi^{3+}$ and $Sb^{3+}$; X comprises at least one selected from a group consisting of $Cl^-$, $Br^-$ and $I^-$.

8. The manufacturing method of the light-emitting device according to claim 1, wherein the forming the perovskite-type light-emitting layer on the first surface treated by the plasma treatment by using the precursor solution for forming the perovskite-type light-emitting layer comprises:
    spin-coating the precursor solution for forming the perovskite-type light-emitting layer on the first surface treated by the plasma treatment;
    adding a second solvent to the precursor solution for forming the perovskite-type light-emitting layer in a process of the spin-coating, wherein the second solvent is immiscible with the first solvent; and
    performing an annealing treatment to obtain the perovskite-type light-emitting layer.

9. The manufacturing method of the light-emitting device according to claim 8, wherein the first solvent is at least one selected from a group consisting of anhydrous N, N-dimethylformamide (DMF), dimethyl sulfoxide (DMSO), gamma-butyrolactone (GBL) and acetonitrile (ACN), and the second solvent comprises at least one selected from a group consisting of toluene, chloroform, chlorobenzene and acetone.

10. The manufacturing method of the light-emitting device according to claim 8, wherein a temperature for the annealing treatment is ranged from 70° C. to 80° C., and a time for the annealing treatment is ranged from 20 minutes to 40 minutes.

11. The manufacturing method of the light-emitting device according to claim 1, further comprising:
    dissolving AI and $B(I)_m$ which are used as solutes in the first solvent to form a first precursor solution, and
    forming a perovskite-type light-emitting layer emitting red light on the first surface treated by the plasma treatment by using the first precursor solution, wherein AI reacts with $B(I)_m$ to generate $ABI_3$.

12. The manufacturing method of the light-emitting device according to claim 1, further comprising:
    dissolving ABr and $B(Br)_m$ which serve as solutes in the first solvent to form a second precursor solution, and
    forming a perovskite-type light-emitting layer emitting green light on the first surface treated by the plasma treatment by using the second precursor solution, wherein reacting ABr reacts with $B(Br)_m$ to generate $AB(Br)_3$.

13. The manufacturing method of the light-emitting device according to claim 1, further comprising:
    dissolving ACl and $B(Br)_m$ which serve as solutes in the first solvent to form a third precursor solution, and
    forming a perovskite-type light-emitting layer emitting blue light on the first surface treated by the plasma treatment, wherein ACl reacts with $B(Br)_m$ to generate $AB(Br)_2Cl$.

14. The manufacturing method of the light-emitting device according to claim 1, further comprising:

performing an annealing treatment on the function layer before performing the plasma treatment.

15. A light-emitting device, comprising:
a function layer, wherein the function layer has a first surface treated by a plasma treatment; and
a perovskite-type light-emitting layer in direct contact with the first surface of the function layer, wherein the first surface of the function layer contains a hydrophilic group;
the perovskite-type light-emitting layer is formed on the first surface treated by the plasma treatment by using a precursor solution for forming the perovskite-type light-emitting layer, wherein $AX_n$ reacts with $BX_m$ to generate $ABX_3$, A is metal cation or alkyl ammonium salt ion, B is metal cation, and X is halogen anion, and both m and n are positive integers; and
the precursor solution is formed by dissolving $AX_n$ and $BX_m$, which are used as solutes in a first solvent.

16. The light-emitting device according to claim 15, wherein the plasma comprises at least one selected from a group consisting of oxygen plasma, nitrogen plasma and argon plasma.

17. The light-emitting device according to any one of claim 15, wherein the function layer is a hole injection layer, and a material of the function layer comprises at least one selected from a group consisting of poly(3,4-ethylenedioxythiophene)-poly(styrene sulfonic acid) (PEDOT:PSS), polyvinyl carbazole (PVK) and pentafluorobenzyl (PFB).

18. The light-emitting device according to claim 17, wherein the material of the function layer is poly(3,4-ethylenedioxythiophene)-poly(styrene sulfonic acid) (PEDOT:PSS), and the function layer made of the PEDOT:PSS has a surface close to the perovskite-type light-emitting layer, and the surface of the function layer serves as the first surface, contains the hydrophilic group and is in direct contact with the perovskite-type light-emitting layer.

19. The light-emitting device according to claim 15, wherein the function layer is an electron injection layer, a material of the function layer comprises zinc oxide (ZnO), the function layer made of ZnO has a surface close to the perovskite-type light-emitting layer, the surface of the function layer serves as the first surface, has the hydrophilic group and is in direct contact with the perovskite-type light-emitting layer.

* * * * *